United States Patent
Hudson et al.

(10) Patent No.: US 7,396,769 B2
(45) Date of Patent: Jul. 8, 2008

(54) METHOD FOR STRIPPING PHOTORESIST FROM ETCHED WAFER

(75) Inventors: Eric A. Hudson, Berkeley, CA (US); Peter Cirigliano, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 311 days.

(21) Appl. No.: 10/910,059

(22) Filed: Aug. 2, 2004

(65) Prior Publication Data

US 2006/0024968 A1    Feb. 2, 2006

(51) Int. Cl.
H01L 21/311 (2006.01)
H01L 21/302 (2006.01)
H01L 21/461 (2006.01)

(52) U.S. Cl. .............. 438/700; 438/714; 438/689; 438/709

(58) Field of Classification Search ............... 438/700, 438/709–710, 706, 714, 725, 689, 691
See application file for complete search history.

(56) References Cited

U.S. PATENT DOCUMENTS

| | | | |
|---|---|---|---|
| 4,376,672 A | 3/1983 | Wang et al. | |
| 4,484,979 A | 11/1984 | Stocker | |
| 4,659,426 A | 4/1987 | Fuller et al. | |
| 4,791,073 A | 12/1988 | Nagy et al. | |
| 4,923,828 A | 5/1990 | Gluck et al. | |
| 6,071,822 A | 6/2000 | Donohue et al. | |
| 6,100,200 A | 8/2000 | Van Buskirk et al. | |
| 6,114,259 A | 9/2000 | Sukharev et al. | |
| 6,235,453 B1 | 5/2001 | You et al. | |
| 6,413,877 B1 | 7/2002 | Annapragada | |
| 6,583,067 B2 * | 6/2003 | Chang et al. | 438/723 |
| 6,632,903 B2 | 10/2003 | Jung et al. | |
| 6,673,721 B1 | 1/2004 | Kim et al. | |
| 6,686,271 B2 | 2/2004 | Raaijmakers et al. | |
| 6,734,096 B2 | 5/2004 | Dalton et al. | |
| 6,797,633 B2 * | 9/2004 | Jiang et al. | 438/706 |
| 6,800,558 B1 | 10/2004 | Chang et al. | |
| 6,805,139 B1 * | 10/2004 | Savas et al. | 134/1.3 |
| 2001/0005632 A1 | 6/2001 | Seta et al. | |
| 2002/0076935 A1 | 6/2002 | Maex et al. | |
| 2002/0081855 A1 | 6/2002 | Jiang et al. | |
| 2002/0102843 A1 | 8/2002 | Seta et al. | |
| 2003/0075524 A1 | 4/2003 | Kawaguchi et al. | |
| 2003/0094432 A1 | 5/2003 | Wu et al. | |

(Continued)

OTHER PUBLICATIONS

U.S. Appl. No. 10/712,326, "Minimizing the Loss of Barrier Materials during Photoresist Stripping", by inventors Annapragada et al., filed Nov. 12, 2003.

(Continued)

*Primary Examiner*—Chuong A. Luu
(74) *Attorney, Agent, or Firm*—Beyer Law Group LLP

(57) ABSTRACT

A method of forming a feature in a low-k (k<3.0) dielectric layer is provided. A low-k dielectric layer is placed over a substrate. A patterned photoresist mask is placed over the low-k dielectric layer. At least one feature is etched into the low-k dielectric layer. A stripping gas comprising $CO_2$ is provided. A plasma is formed from the stripping gas comprising $CO_2$. The plasma from the stripping gas comprising $CO_2$ is used to strip the patterned photoresist mask.

16 Claims, 5 Drawing Sheets

U.S. PATENT DOCUMENTS

| | | |
|---|---|---|
| 2003/0129539 A1 | 7/2003 | Tsai et al. |
| 2004/0018715 A1 | 1/2004 | Sun et al. |
| 2004/0063330 A1 | 4/2004 | Crawford |
| 2004/0072430 A1 | 4/2004 | Huang et al. |
| 2004/0149686 A1 | 8/2004 | Zhang et al. |
| 2004/0180269 A1 | 9/2004 | Balasubramaniam et al. |
| 2004/0192058 A1* | 9/2004 | Chu et al. .................. 438/710 |
| 2004/0224520 A1* | 11/2004 | Yun et al. .................. 438/691 |
| 2005/0006346 A1* | 1/2005 | Annapragada et al. ........ 216/67 |
| 2005/0101135 A1* | 5/2005 | Annapragada et al. ...... 438/689 |

OTHER PUBLICATIONS

U.S. Appl. No. 10/738,280, "Method of Preventing Damage to Porous Low-K Materials during Resist Stripping", by inventors Annapragada et al., filed Dec. 16, 2003.

U.S. Appl. No. 10/866,382, "Preventing Damage to Low-K Materials during Resist Stripping", by inventors Li et al., filed Jun. 10, 2004.

International Search Report, dated Oct. 28, 2005.

* cited by examiner

METHOD FOR STRIPPING PHOTORESIST FROM ETCHED WAFER

BACKGROUND OF THE INVENTION

The present invention relates to the fabrication of semiconductor-based devices. More particularly, the present invention relates to improved techniques for fabricating semiconductor-based devices with low-k dielectric layers.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias, and trenches may be etched into the dielectric material and filled with copper. The excess copper may be removed by chemical mechanical polishing (CMP) leaving copper lines connected by vias for signal transmission. To reduce the RC delays even further, porous and non-porous low-k dielectric constant materials may be used. In the specification and claims low-k is defined as k<3.0.

Porous and non-porous (dense) low dielectric constant materials may include organo-silicate-glass (OSG) materials, which are also called carbon-doped silicates. OSG materials may be silicon dioxide doped with organic components such as methyl groups. OSG materials have carbon and hydrogen atoms incorporated into a silicon dioxide lattice, which lowers the dielectric constant of the material. However, OSG materials may be susceptible to damage when exposed to $O_2$, $H_2$, $N_2$, and $NH_3$ gases, which are used for stripping photoresist or fluorine within a stripping plasma. It is believed that such damage may be caused by the removal of carbon from the low-k dielectric, which increases the dielectric constant and makes the material more hydrophilic so that it retains moisture. The retention of moisture creates metal barrier adhesion problems or may cause other barrier problems.

The damaging effects of stripping plasmas can penetrate deeper into porous material, compared to dense materials. Porous OSG materials (with k<2.5) may be very susceptible to damage due to the removal of organic content by exposure to the plasma used to strip the resist and sidewalls. The plasma may diffuse into the pores of the porous OSG layer and cause damage as far as 300 nm into the OSG layer. Part of the damage caused by the plasma is the removal of carbon and hydrogen from the damaged area causing the OSG to be more like silicon dioxide, which has a higher dielectric constant. Damage may be quantified by measuring the change in SiC/SiO ratio of the OSG layer from FTIR analysis. For the typical trench etch application, the modification of OSG more than 3-5 nm into the trench sidewall is unacceptable.

It is desirable to reduce damage to low-k (k<3.0) dielectric layers during the stripping process.

SUMMARY OF THE INVENTION

To achieve the foregoing and other objectives and in accordance with the purpose of the present invention a method of forming a feature in a low-k dielectric layer is provided. A low-k dielectric layer is placed over a substrate. A patterned photoresist mask is placed over the low-k dielectric layer. At least one feature is etched into the low-k dielectric layer. A stripping gas comprising $CO_2$ is provided. A plasma is formed from the stripping gas comprising $CO_2$. The products from the plasma from the stripping gas comprising $CO_2$ is used to strip the patterned photoresist mask.

In another manifestation of the invention method of forming a feature in an organosilicate glass layer is provided. An organo silicate glass layer is placed over a substrate. A patterned photoresist mask is placed over the organo silicate glass layer. At least one feature is etched into the organo silicate glass layer. A stripping gas comprising $CO_2$ is provided. A plasma is formed from the stripping gas comprising $CO_2$. The products from the plasma from the stripping gas comprising $CO_2$ is used to strip the patterned photoresist mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Without being bound by theory, it is believed that most of the damage to the low-k dielectric layer occurs during stripping, because stripping removes an organic resist material, and this process tends to also remove carbon from the low-k dielectric. In addition, it is believed that damage is more noticeable as a result of a trench strip than a via strip, since trenches are more closely spaced and having more capacitance between each other. It is also believed that such damage is a greater problem with small features than large features. It is also believed that such damage is more of a problem on the sidewall of a trench than the bottom of a trench.

Figure 1:
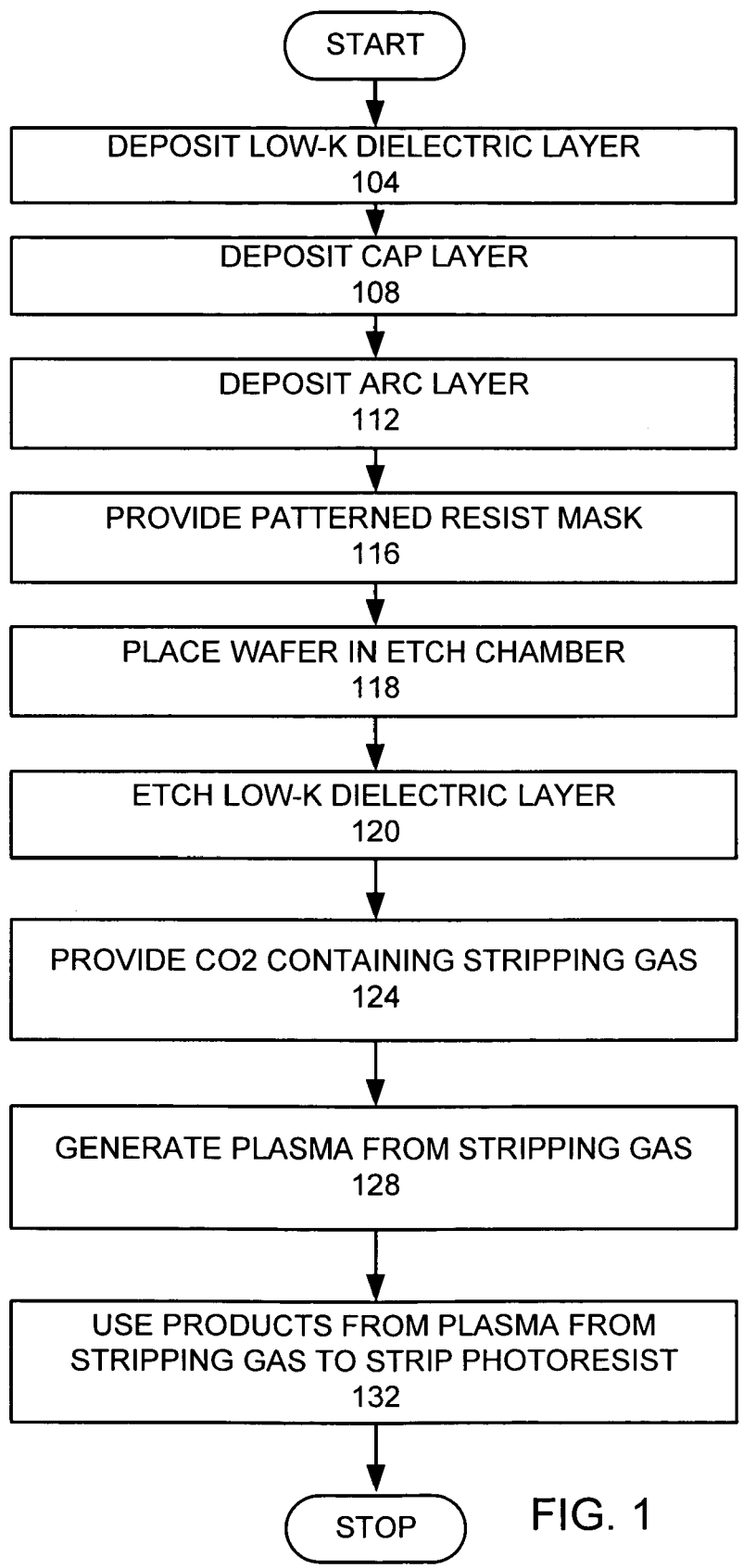
FIG. 1 is a flow chart of a process used in an embodiment of the invention.
Figure 2A:
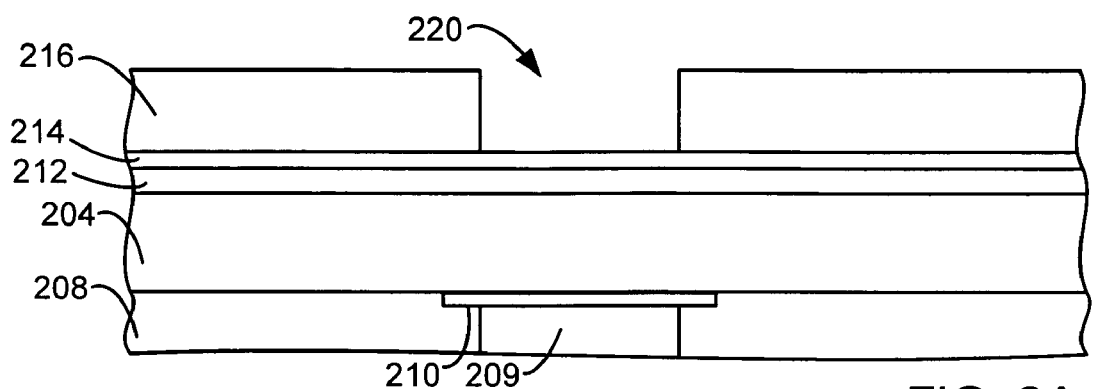
FIGS. 2A-C are schematic side views of an etched porous low-K dielectric layer according to the process of FIG. 1.
Figure 2B:
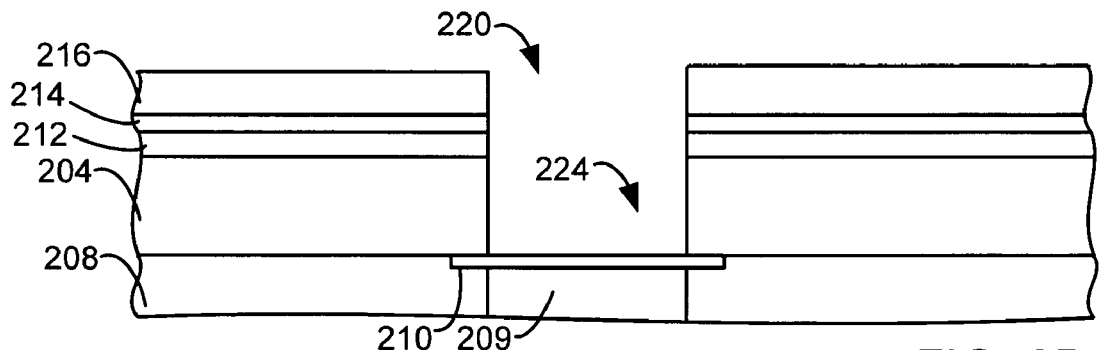
Figure 2C:
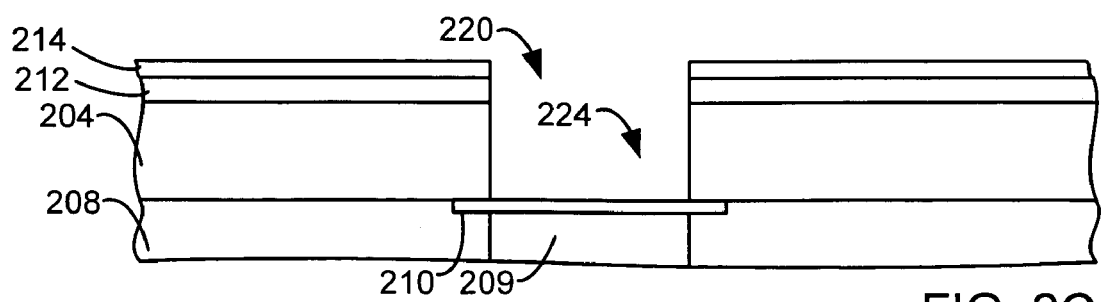

To facilitate discussion, FIG. 1 is a flow chart of an etching process of low-k dielectric layer used in an embodiment of the invention. Preferably, the low-k dielectric layer is an organosilicate glass (OSG). FIGS. 2A-C are schematic side views of a low-k dielectric layer according to the process of FIG. 1. A low-k dielectric layer 204 may be deposited on a substrate 208 (step 104), as shown in FIG. 2A. The substrate 208 may be a silicon wafer or another type of material or may be part of a layer over a wafer. A cap layer 212 is formed over the low-k dielectric layer 204 (step 108). The cap layer 212 may be silicon oxide or silicon carbide. Generally, the cap layer is a protective layer of a dielectric material. The cap layer 212 protects the low-k dielectric layer 204 during chemical mechanical polishing (CMP) and other processes. The cap layer 212 may be a low-k dielectric, since the cap layer is part of the end product. Preferably, the cap layer is of a silicon oxide or silicon carbide base material. In other embodiments, there may be more than one cap layer or no cap layer. An antireflective coating (ARC) 214 is deposited over the cap layer 212 (step 112). The antireflective coating (ARC) 214 may be an organic bottom antireflective coating (BARC) or an inorganic dielectric antireflective coating (DARC). A patterned resist mask 216 is provided over the ARC 214 (step 116). The patterned resist mask 216 has an aperture 220. The patterned resist mask may be formed by placing a layer of photoresist, which is exposed to a light pattern and then etched. Other methods of forming a patterned resist mask may be used. The substrate 208 may have a contact 209 and a barrier layer 210.

The substrate 208 is placed in an etching chamber (step 118), where the low-k dielectric layer 204 is etched (step 120). A plasma dry etch may be used to etch the low-k dielectric layer 204, which forms an opening 224 under the aperture 220 in the patterned resist mask 216, as shown in FIG. 2B. Some of the patterned resist mask 216 is removed during the low-k dielectric layer etch. Such low-k dielectric etch processes may use a fluorine based etchant. For example, an etch process may use these mixtures of source gases: $CF_4/N_2$ or $C_4F_8/N_2$. As a result, the sidewalls of the feature may be etched. In addition, such etch processes may deposit polymer.

After the etching of the low-k dielectric is completed, a stripping gas comprising $CO_2$ is provided into the etch chamber (step 124). A plasma is generated from the stripping gas comprising $CO_2$ (step 128). Products from the plasma generated from the stripping gas comprising $CO_2$ are then used to strip the photoresist 216 (step 132), as shown in FIG. 2C. Ions like $O_2^+$ and neutrals like O and $O_2^*$ (metastable) are among the products.

In some embodiments of the invention, the barrier layer 210 may be opened before or after the photoresist 216 is stripped.

Figure 3:
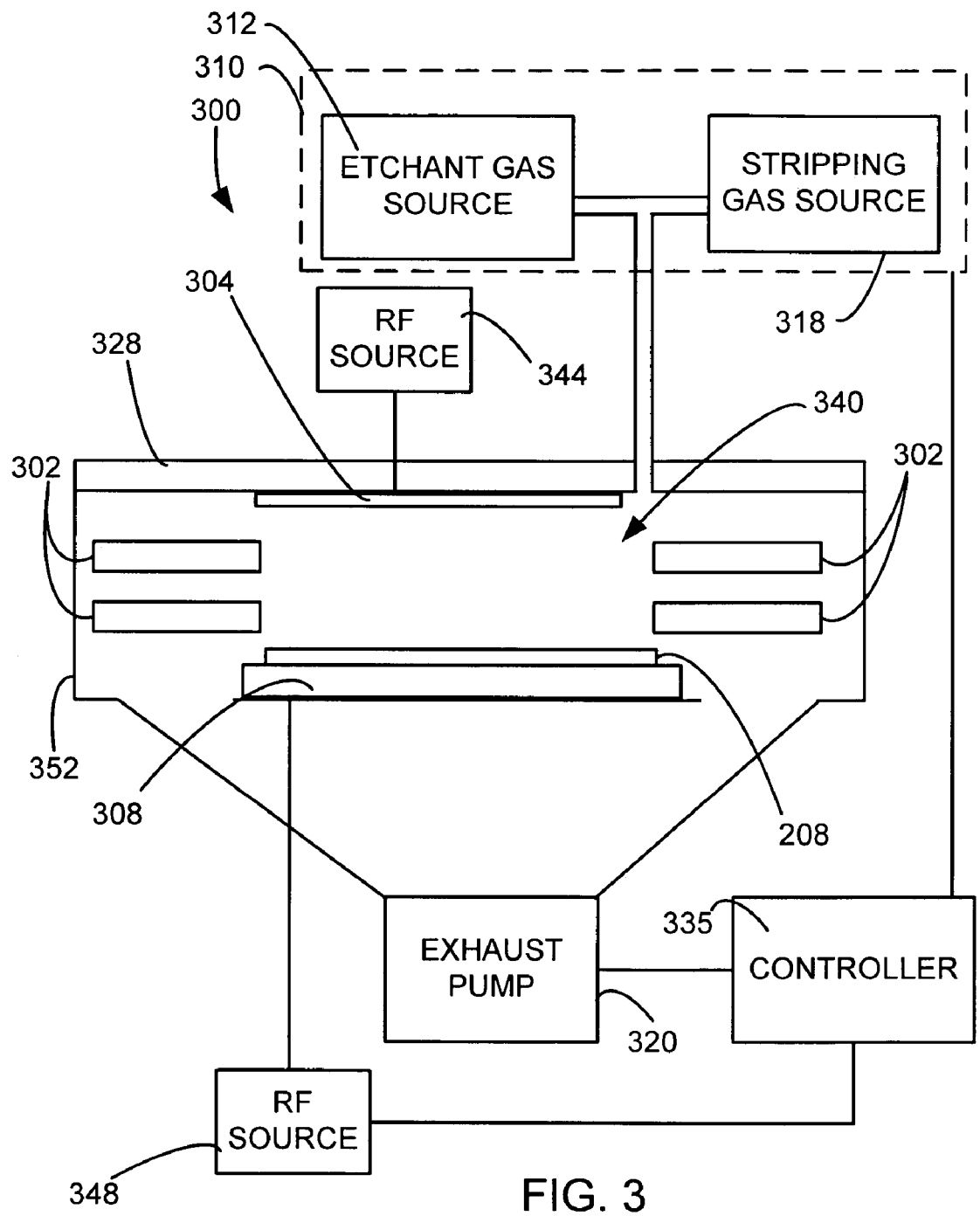
FIG. 3 is a schematic view of a process chamber that may be used in an embodiment of the invention.

FIG. 3 is a schematic view of a plasma processing chamber 300 that may be used for etching the feature, and then stripping the photoresist in situ. The plasma processing chamber 300 comprises confinement rings 302, an upper electrode 304, a lower electrode 308, a gas source 310, and an exhaust pump 320. The gas source 310 comprises an etchant gas source 312 and a stripping gas source 318. The gas source 310 may comprise additional gas sources. Within plasma processing chamber 300, the substrate 208 is positioned upon the lower electrode 308. The lower electrode 308 incorporates a suitable substrate chucking mechanism (e.g., electrostatic, mechanical clamping, or the like) for holding the substrate 208. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. A first RF source 344 is electrically connected to the upper electrode 304. A second RF source 348 is electrically connected to the lower electrode 308. Chamber walls 352 surround the confinement rings 302, the upper electrode 304, and the lower electrode 308. Both the first RF source 344 and the second RF source 348 may comprise a 27 MHz to 60 MHz power source and a 2 MHz power source. Different combinations for connecting different frequencies of RF power to the upper and lower electrode are possible. An Exelan 2300™, which is made by Lam Research Corporation™ of Fremont, Calif., may be used in a preferred embodiment of the invention. For the Exelan 2300, the second power source 348 comprises both a 27 MHz power source and a 2 MHz power source. The upper electrode 304 is grounded.

Figure 4A:
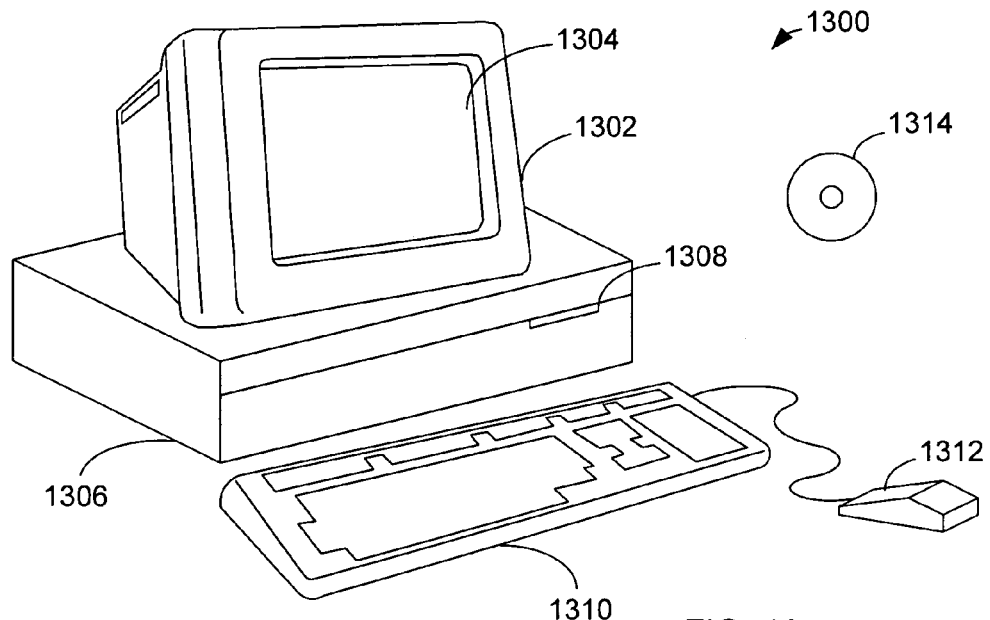
FIGS. 4A-B are schematic views of a computer system that may be used as a controller.
Figure 4B:
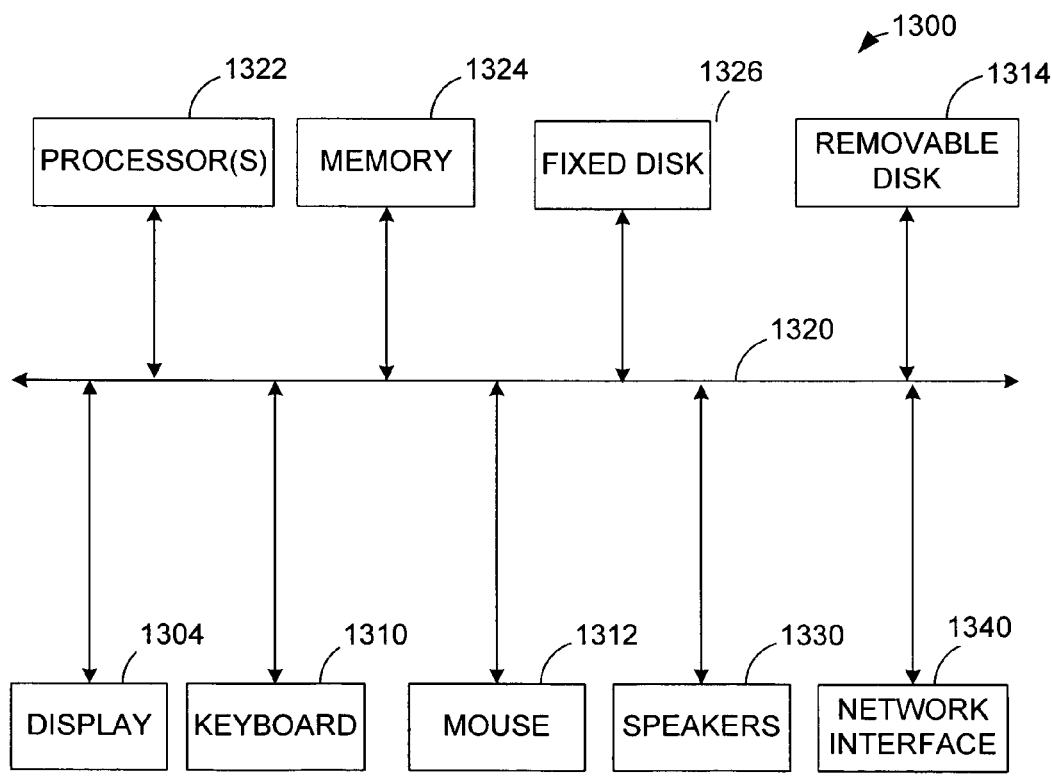

FIGS. 4A and 4B illustrate a computer system 1300, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Without being bound by theory, it is believed that an oxidizing stripping process provides a faster and more complete stripping than a reducing stripping process. In addition, it was generally believed that oxygen radicals were the only source of OSG damage. It has been unexpectedly found that there is a correlation between excited $O_2$ molecules and dielectric damage. By providing $CO_2$ instead of $O_2$ as a source of oxygen for an oxidation stripping plasma, the amount of excited $O_2$ is reduced or eliminated. The result is a stripping process with some of the benefits of oxidizing chemistry but with reduced damage to OSG. It is believed that the inventive process provides a method for stripping photoresist in the presence of sensitive low-k dielectric materials, producing minimal damage to the low-k material yet providing the high photoresist removal rate and effective residue removal benefits of an oxidizing strip chemistry.

EXAMPLE

In one example of the invention, the etch chamber is an Exelan 2300. A low pressure of 12 mTorr was provided to the etch chamber. 400 watts was provided at 27 MHz. 100 sccm $CO_2$ was provided. The etch chamber temperature was maintained at about 20° C. A plasma generated from the CO2 is used to strip the photoresist mask.

Figure 5A:
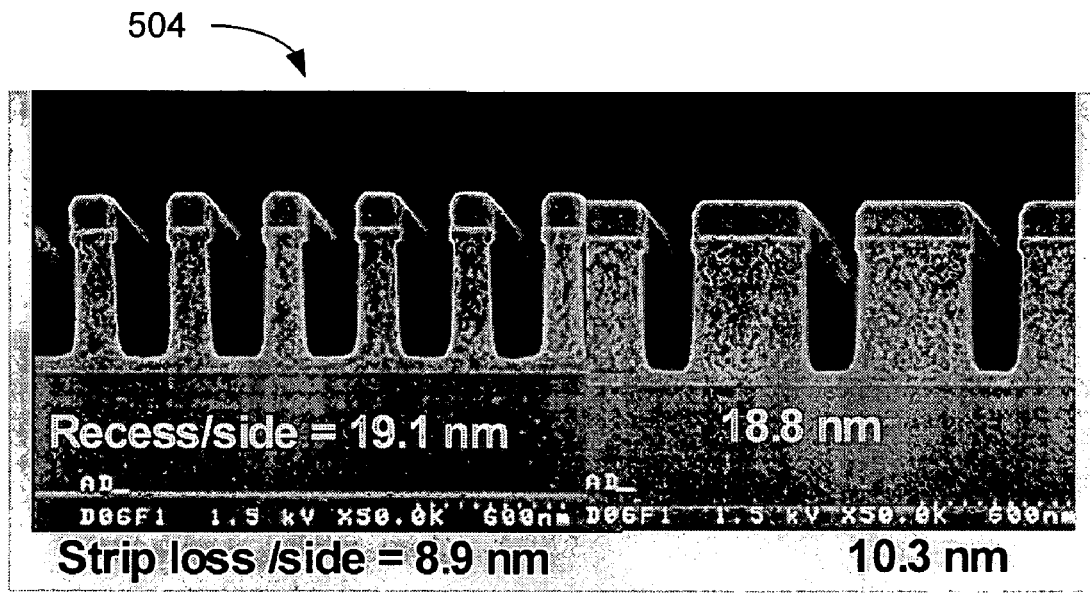
FIGS. 5A-B are micrographs of a wafer structure that has been stripped using the inventive process.
Figure 5B:
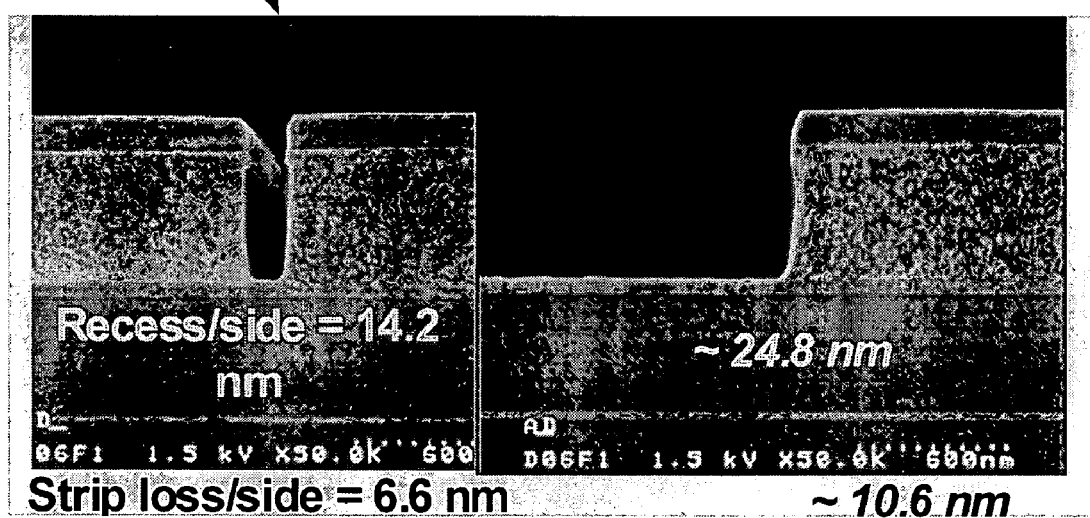

FIGS. 5A-B are cross-sectional micrographs of a wafer that has been stripped using the stripping process of the above example. The film stack includes a porous OSG material with k~2.2. Damaged OSG film is removed by a dilute HF bath. By comparing the micrographs of trench features before and after dipping in HF, the thickness of the damaged film on the sidewall may be measured. By comparing to pre-strip results, the extent of damage induced only by the strip may be determined. In this case, the strip-induced sidewall damage is very low for porous OSG: ~7-11 nm/side, for trench features of several different widths and pitches.

The foregoing example is representative of one embodiment of the invention, in which the strip process is performed using an etch configuration, such that the wafer is directly exposed to the influence of the plasma, including charged particles. In some cases a bias RF power would be applied to the wafer. Without being bound by theory, it is believed that this bias power increases the ion bombardment energy and therefore increases the photoresist removal rate and the efficiency of residue removal. Process conditions are defined as follows for this embodiment of the invention.

It is preferable that the stripping gas comprises at least 25% $CO_2$. It is more preferable that the stripping gas comprises at least 50% $CO_2$. It is most preferable that the stripping gas comprises at least 75% $CO_2$. Examples of stripping gas mixtures comprising $CO_2$ may be combinations of $CO_2+O_2$, $CO_2+CO$, $CO_2+CO+O_2$, $CO_2+H_2O+O_2$, $CO_2+CO+H_2O$, $CO2+N_2$, and $CO_2+H_2$. Various inert gases may also be added in combination with these mixtures or with $CO_2$ only.

It is preferable that the inventive stripping process be performed with a chamber pressure of between 0.1 and 600 mTorr. It is more preferable that the inventive stripping process be performed with a chamber pressure between 1 and 200 mTorr. It is most preferable that the inventive stripping process be performed with a chamber pressure between 5 and 100 mTorr.

It is preferable that the inventive stripping process be performed with an input power of between 10 and 2000 Watts. It is more preferable that the inventive stripping process be performed with an input power between 50 and 1200 Watts. It is most preferable that the inventive stripping process be performed with an input power between 100 and 1000 Watts.

In other embodiments, a downstream stripper may be used to practice an embodiment of the invention. In this embodiment, the wafer is not exposed directly to the $CO_2$ plasma, but instead only the neutral products from the $CO_2$ plasma. Therefore, in this embodiment, only the neutral products from the $CO_2$ plasma are being used to provide stripping. In a downstream stripper the process parameters may deviate significantly from those given above for a different embodiment. Process conditions are defined as follows for the downstream embodiment of the invention.

It is preferable that the stripping gas comprises at least 0.1% $CO_2$. It is more preferable that the stripping gas comprises at least 1% $CO_2$. It is most preferable that the stripping gas comprises at least 5% $CO_2$. Examples of stripping gas mixtures comprising $CO_2$ may be combinations of $CO_2+O_2$, $CO_2+CO$, $CO_2+CO+O_2$, $CO_2+H_2O+O_2$, $CO_2+CO+H_2O$, $CO2+N_2$, and $CO_2+H_2$. Various inert gases may also be added in combination with these mixtures or with $CO_2$ only.

It is preferable that the inventive stripping process be performed with a chamber pressure of between 100 and 10000 mTorr. It is more preferable that the inventive stripping process be performed with a chamber pressure between 250 and 5000 mTorr. It is most preferable that the inventive stripping process be performed with a chamber pressure between 500 and 3000 mTorr.

It is preferable that the inventive stripping process be performed with an input power of between 10 and 5000 Watts. It is more preferable that the inventive stripping process be performed with an input power between 100 and 3000 Watts. It is most preferable that the inventive stripping process be performed with an input power between 500 and 2500 Watts.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A method of forming a feature in a low-k dielectric layer of a porous organosilicate glass, comprising:
    placing a low-k dielectric layer of a porous organosilicate glass over a substrate;
    placing a patterned photoresist mask over the low-k dielectric layer;
    etching at least one feature into the low-k dielectric layer;
    providing a stripping gas comprising $CO_2$, wherein the stripping gas has a total flow rate and a flow rate of $CO_2$ is at least 25% of the total flow rate;
    forming a plasma from the stripping gas comprising $CO_2$; and
    using products from the plasma from the stripping gas comprising $CO_2$ to strip the patterned photoresist mask.

2. The method, as recited in claim 1, wherein the using products from the plasma from the stripping gas exposes the photoresist mask to the plasma products from the stripping gas.

3. The method, as recited in claim 2, wherein the stripping gas consists essentially of an inert gas and $CO_2$.

4. The method, as recited in claim 3, wherein the stripping gas consists essentially of $CO_2$.

5. The method, as recited in claim 1, wherein the flow rate of $CO_2$ is at least 50% of the total flow rate.

6. The method, as recited in claim 5, further comprising forming an antireflective coating over the low-k dielectric layer before placing the patterned photoresist mask over the low-k dielectric layer.

7. The method, as recited in claim 6, the using the products from the plasma from the stripping gas to strip the patterned photoresist mask is performed in situ in a same etch chamber where the etching of at least one feature is performed and wherein the using products from the plasma from the stripping gas exposes the photoresist mask to the plasma from the stripping gas.

8. The method, as recited in claim 7, further comprising placing at least one cap layer over the low-k dielectric layer before placing the photoresist mask, wherein the photoresist mask is placed over the cap layer.

9. The method, as recited in claim 1, further comprising forming an antireflective coating over the low-k dielectric layer before placing the patterned photoresist mask over the low-k dielectric layer.

10. The method, as recited in claim 1, the using the products from the plasma from the stripping gas to strip the patterned photoresist mask is performed in situ in a same etch chamber where the etching the at least one feature is performed and wherein the using products from the plasma from the stripping gas exposes the photoresist mask to the plasma from the stripping gas.

11. The method, as recited in claim 1, further comprising placing at least one cap layer over the low-k dielectric layer before placing the photoresist mask, wherein the photoresist mask is placed over the cap layer.

12. A method of forming a feature in an organosilicate glass layer, comprising:
   placing an organo silicate glass layer over a substrate, wherein the placing the organo silicate glass layer over the substrate further comprises making the organosilicate glass layer porous;
   placing a patterned photoresist mask over the organo silicate glass layer;
   etching at least one feature into the organo silicate glass layer;
   providing a stripping gas comprising $CO_2$;
   forming a plasma from the stripping gas comprising $CO_2$; and
   using the plasma from the stripping gas comprising $CO_2$ to strip the patterned photoresist mask.

13. The method, as recited in claim 12, wherein the stripping gas has a total flow rate, wherein the $CO_2$ has a flow rate that is greater than 0.1% of the total flow rate of the stripping gas.

14. The method, as recited in claim 12, the using the plasma from the stripping gas to strip the patterned photoresist mask is performed in situ in a same etch chamber where the etching the at least one feature is performed and wherein the stripping gas has a total flow rate, wherein the $CO_2$ has a flow rate greater than 25% of the total flow rate of the stripping gas and wherein the using the plasma from the stripping gas exposes the photoresist mask to the plasma from the stripping gas.

15. The method, as recited in claim 12, wherein the $CO_2$ has a flow rate greater than 25% of a total flow rate of the stripping gas.

16. The method, as recited in claim 11, further comprising placing at least one antireflective coating over the at least one cap layer before placing the photoresist mask, wherein the photoresist mask is also placed over the antireflective coating layer.

* * * * *